United States Patent
Forbes

(10) Patent No.: US 6,979,857 B2
(45) Date of Patent: Dec. 27, 2005

(54) APPARATUS AND METHOD FOR SPLIT GATE NROM MEMORY

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/719,772

(22) Filed: Nov. 21, 2003

(65) Prior Publication Data

US 2005/0001258 A1 Jan. 6, 2005

Related U.S. Application Data

(63) Continuation-in-part of application No. 10/612,725, filed on Jul. 1, 2003.

(51) Int. Cl.[7] .................. H01L 29/76; H01L 29/94; H01L 31/062; H01L 31/113; H01L 31/119
(52) U.S. Cl. .................. 257/314; 257/315; 257/316; 257/317; 257/318; 438/259
(58) Field of Search ................. 257/314–326

(56) References Cited

U.S. PATENT DOCUMENTS

| 4,184,207 A | 1/1980 | McElroy |
| 4,420,504 A | 12/1983 | Cooper |
| 4,755,864 A | 7/1988 | Ariizumi |

(Continued)

FOREIGN PATENT DOCUMENTS

| EP | 84303740.9 | 1/1985 |
| EP | 90115805.5 | 2/1991 |
| EP | 01113179.4 | 12/2002 |

OTHER PUBLICATIONS

B. Eitan et al., "Characterization of Channel Hot Electron Injection by the Subthreshold Slope of NROM™ Device," IEEE Electron Devices Lett., vol. 22, No. 11, (Nov. 2001) pp. 556–558, Copyright 2001 IEEE.

B. Eitan et al., "Spatial Characterization of Hot Carriers Injected into the Gate Dielectric Stack of a MOFSET Based on Non-Volatile Memory Device," date unknown, pp. 58–60.

(Continued)

*Primary Examiner*—Tom Thomas
*Assistant Examiner*—Jesse A. Fenty
(74) *Attorney, Agent, or Firm*—Leffert Jay & Polglaze, P.A.

(57) ABSTRACT

A split gate, vertical NROM memory cell is comprised of a plurality of oxide pillars that each has a source/drain region formed in the top of the pillar. A trench is formed between each pair of oxide pillars. A polysilicon control gate is formed in the trench between the pair of oxide pillars. A polysilicon program gate is formed between the control gate and each oxide pillar. The program gates extend along the sidewall of each oxide pillar. A gate insulator layer is formed between each program gate and the adjacent oxide pillar. Each gate insulator layer has a structure for trapping at least one charge. In one embodiment, the gate insulator structure is an oxide-nitride-oxide layer in which the charge is stored at the trench bottom end of the nitride layer. An interpoly insulator is formed between the program gates and the control gate.

23 Claims, 13 Drawing Sheets

U.S. PATENT DOCUMENTS

| | | | |
|---|---|---|---|
| 4,881,114 | A | 11/1989 | Mohsen |
| 4,964,080 | A * | 10/1990 | Tzeng .................... 365/185.01 |
| 5,241,496 | A | 8/1993 | Lowrey |
| 5,330,930 | A | 7/1994 | Chi |
| 5,378,647 | A | 1/1995 | Hong |
| 5,379,253 | A | 1/1995 | Bergemont |
| 5,397,725 | A | 3/1995 | Wolstenholme |
| 5,467,305 | A | 11/1995 | Bertin |
| 5,467,308 | A | 11/1995 | Chang et al. |
| 5,576,236 | A | 11/1996 | Chang |
| 5,768,192 | A | 6/1998 | Eitan |
| 5,792,697 | A | 8/1998 | Wen |
| 5,858,841 | A | 1/1999 | Hsu |
| 5,911,106 | A | 6/1999 | Tasaka |
| 5,936,274 | A | 8/1999 | Forbes |
| 5,946,558 | A | 8/1999 | Hsu |
| 5,966,603 | A | 10/1999 | Eitan |
| 5,969,384 | A * | 10/1999 | Hong ......................... 257/322 |
| 5,994,745 | A | 11/1999 | Hong |
| 6,011,725 | A | 1/2000 | Eitan |
| 6,028,342 | A | 2/2000 | Chang |
| 6,030,871 | A | 2/2000 | Eitan |
| 6,044,022 | A | 3/2000 | Nachumovsky |
| 6,069,042 | A * | 5/2000 | Chien et al. ................. 438/266 |
| 6,081,456 | A | 6/2000 | Dadashev |
| 6,108,240 | A | 8/2000 | Lavi |
| 6,133,102 | A | 10/2000 | Wu |
| 6,134,156 | A | 10/2000 | Eitan |
| 6,143,636 | A | 11/2000 | Forbes |
| 6,147,904 | A | 11/2000 | Liron |
| 6,157,570 | A | 12/2000 | Nachumovsky |
| 6,172,396 | B1 | 1/2001 | Chang |
| 6,174,758 | B1 | 1/2001 | Nachumovsky |
| 6,175,523 | B1 | 1/2001 | Yang |
| 6,181,597 | B1 | 1/2001 | Nachumovsky |
| 6,184,089 | B1 | 2/2001 | Chang |
| 6,191,459 | B1 | 2/2001 | Hofmann et al. |
| 6,201,282 | B1 | 3/2001 | Eitan |
| 6,201,737 | B1 | 3/2001 | Hollmer |
| 6,204,529 | B1 | 3/2001 | Lung |
| 6,207,504 | B1 | 3/2001 | Hsieh |
| 6,207,992 | B1 | 3/2001 | Mori |
| 6,208,164 | B1 | 3/2001 | Noble |
| 6,208,557 | B1 | 3/2001 | Bergemont |
| 6,215,702 | B1 | 4/2001 | Derhacobian |
| 6,218,695 | B1 | 4/2001 | Nachumovsky |
| 6,222,768 | B1 | 4/2001 | Hollmer |
| 6,238,976 | B1 | 5/2001 | Noble |
| 6,240,020 | B1 | 5/2001 | Yang |
| 6,243,300 | B1 | 6/2001 | Sunkavalli |
| 6,249,460 | B1 | 6/2001 | Forbes |
| 6,251,731 | B1 | 6/2001 | Wu |
| 6,255,166 | B1 | 7/2001 | Ogura |
| 6,256,231 | B1 | 7/2001 | Lavi |
| 6,266,281 | B1 | 7/2001 | Derhacobian |
| 6,269,023 | B1 | 7/2001 | Derhacobian |
| 6,272,043 | B1 | 8/2001 | Hollmer |
| 6,275,414 | B1 | 8/2001 | Randolph |
| 6,282,118 | B1 | 8/2001 | Lung |
| 6,291,854 | B1 | 9/2001 | Peng |
| 6,297,096 | B1 | 10/2001 | Boaz |
| 6,303,436 | B1 | 10/2001 | Sung |
| 6,327,174 | B1 | 12/2001 | Jung |
| 6,337,808 | B1 | 1/2002 | Forbes |
| 6,348,711 | B1 | 2/2002 | Eitan |
| 6,383,871 | B1 | 5/2002 | Noble |
| 6,384,448 | B1 | 5/2002 | Forbes |
| 6,392,930 | B2 | 5/2002 | Jung |
| 6,417,049 | B1 | 7/2002 | Sung |
| 6,417,053 | B1 | 7/2002 | Kuo |
| 6,421,275 | B1 | 7/2002 | Chen |
| 6,424,001 | B1 | 7/2002 | Forbes |
| 6,429,063 | B1 | 8/2002 | Eitan |
| 6,432,778 | B1 | 8/2002 | Lai |
| 6,433,382 | B1 | 8/2002 | Orlowski et al. |
| 6,436,764 | B1 | 8/2002 | Hsieh |
| 6,440,801 | B1 | 8/2002 | Furukawa et al. |
| 6,461,949 | B1 | 10/2002 | Chang |
| 6,462,378 | B1 * | 10/2002 | Kim ........................... 257/342 |
| 6,462,387 | B1 * | 10/2002 | Lai ............................. 257/390 |
| 6,468,864 | B1 | 10/2002 | Sung |
| 6,469,342 | B1 | 10/2002 | Kuo |
| 6,477,084 | B1 | 11/2002 | Eitan |
| 6,486,028 | B1 | 11/2002 | Chang |
| 6,487,050 | B1 | 11/2002 | Liu |
| 6,496,034 | B2 | 12/2002 | Forbes |
| 6,498,377 | B1 | 12/2002 | Lin |
| 6,514,831 | B1 | 2/2003 | Liu |
| 6,531,887 | B2 | 3/2003 | Sun |
| 6,545,309 | B1 | 4/2003 | Kuo |
| 6,552,287 | B2 | 4/2003 | Janniere |
| 6,559,013 | B1 | 5/2003 | Pan |
| 6,570,213 | B1 * | 5/2003 | Wu ........................... 257/315 |
| 6,576,511 | B2 | 6/2003 | Pan |
| 6,580,135 | B2 | 6/2003 | Chen |
| 6,580,630 | B1 | 6/2003 | Liu |
| 6,597,037 | B1 | 7/2003 | Forbes |
| 6,602,805 | B2 | 8/2003 | Chang |
| 6,607,957 | B1 | 8/2003 | Fan |
| 6,610,586 | B1 | 8/2003 | Liu |
| 6,613,632 | B2 | 9/2003 | Liu |
| 6,617,204 | B2 | 9/2003 | Sung |
| 6,639,268 | B2 | 10/2003 | Forbes |
| 6,762,092 | B2 * | 7/2004 | Yuan et al. ................. 438/257 |
| 2001/0001075 | A1 | 5/2001 | Ngo |
| 2001/0004332 | A1 | 6/2001 | Eitan |
| 2001/0011755 | A1 | 8/2001 | Tasaka |
| 2001/0022375 | A1 | 9/2001 | Hsieh |
| 2002/0130356 | A1 | 9/2002 | Sung |
| 2002/0142569 | A1 | 10/2002 | Chang |
| 2002/0146885 | A1 | 10/2002 | Chen |
| 2002/0151138 | A1 | 10/2002 | Liu |
| 2002/0177275 | A1 | 11/2002 | Liu |
| 2002/0182829 | A1 | 12/2002 | Chen |
| 2003/0015752 | A1 | 1/2003 | Palm |
| 2003/0057997 | A1 | 3/2003 | Sun |
| 2003/0067807 | A1 | 4/2003 | Lin |
| 2003/0113969 | A1 | 6/2003 | Cho |
| 2003/0117861 | A1 | 6/2003 | Maayan |
| 2003/0146565 | A1 * | 8/2003 | Wu ........................... 257/314 |

OTHER PUBLICATIONS

B. Eitan et al., "NROM: A Novel Localized Trapping, 2-Bit Nonvolatile Memory Cell," IEEE Electron Device Lett, vol. 21, No. 11, (Nov. 2000), pp. 543–545, Copyright 2000 IEEE.

E. Maayan et al., "A 512Mb NROM Flash Data Storage Memory with 8MB/s Data Range," Dig. IEEE Int. Solid-State Circuits Conf., San Francisco, (Feb. 2002), pp. 1–8, Copyright Saifun Semiconductors Ltd. 2002.

E. Maayan et al., "A 512Mb NROM Flash Data Storage Memory with 8MB/s Data Range," ISSCC 2002 Visuals Supplement, Session 6, SRAM and Non-Volatile Memories, 6.1 and 6.2, pp. 76–77, 407–408. Copyright 1990 IEEE.

M. Janai, "Data Retention, Endurance and Acceleration Factors of NROM Devices," IEEE 41st Annual International Reliability Physics Symposium, Dallas, TX (2003), pp. 502–505, Copyright 1989 IEEE.

S. Minami and Y. Kamigaki, "A Novel MONOS Nonvolatile Memory Device Ensuring 10–Year Data Retention after $10^7$ Erase/Write Cycles," IEEE Transactions on Electron Devices, vol. 40, No. 11 (Nov. 1993) pp. 2011–2017, Copyright 1998 IEEE.

C. Pan, K. Wu, P. Freiberger, A. Chatterjee, G. Sery, "A Scaling Methodology for Oxide Nitride–Oxide Interpoly Dielectric for EPROM Applications," IEEE Transactions on Electron Devices, vol. 37, No. 6, (Jun. 1990), pp. 1439–1443, Copyright 1990 IEEE.

P. Manos and C. Hart, "A Self–Aligned EPROM Structure with Superior Data Retention," IEEE Electron Device Letters, vol. 11, No. 7, (Jul. 1990) pp. 309–311, Copyright 1990 IEEE.

W. Owen and W. Tchon, "$E^2$PROM Product Issues and Technology Trends," IEEE 1989, pp. 17–19, Copyright 1989 IEEE.

T. Huang, F. Jong, T. Chao, H. Lin, L. Leu, K. Young, C. Lin, K. Chiu, "Improving Radiation Hardness of EEPROM/Flash Cell BY $N_2O$ Annealing," IEEE Electron Device Letters, vol. 19, No. 7 (Jul. 1998), pp. 256–258, Copyright 1998 IEEE.

B. Eitan et al., "Electrons Retention Model for Localized Charge in Oxide–Nitride–Oxide (ONO) Dielectric," IEEE Device Lett., vol. 23, No. 9, (Sep. 2002), pp. 556–558. Copyright 2002 IEEE.

T. Nozaki, T. Tanaka, Y. Kijiya, E. Kinoshita, T. Tsuchiya, Y. Hayashi, "A 1–Mb EEPROM with MONOS Memory Cell for Semiconductor Disk Application," IEEE Journal of Solid–State Circuits, vol. 26, No. 4 (Apr. 1991), pp. 497–501, Copyright 1991 IEEE.

F. Vollebregt, R. Cuppens, F. Druyts, G. Lemmen, F. Verberne, J. Solo, "A New E(E)PROM Technology With A $TiSi_2$ Control Gate," IEEE 1989, pp. 25.8.1–25.8.4, Copyright 1989 IEEE.

B. Eitan et al., "Impact of Programming Charge Distribution on Threshold Voltage and Subthreshold Slope of NROM Memory cells," IEEE Transactions on Electron Devices, vol. 49, No. 11, (Nov. 2002), pp. 1939–1946, Copyright 2002 IEEE.

B. Eitan et al., "Spatial characterization of Channel hot electron injection utilizing subthreshold slope of the localized charge storage NORM™ memory device," Non–Volatile Semiconductor Memory Workshop (NVSMW), Monterey, CA, (Aug. 2001), pp. 1–2.

B. Eitan et al., "Can NROM, a 2–bit, Trapping Storage NVM Cell, Give a Real Challenge to Floating Gate Cells?" Int. Conf. on Solid State Devices and Materials, Tokyo, (1999), pp. 1–3, Copyright 1999 Saifun Semiconductors Ltd.

S. Ogura, et al. "Twin MONOS Cell with Dual Control Gates," Halo LSI and New Halo, pp 187–187.3, Date Unknown.

T. Sugizaki, et al. "New 2–bit/Tr MONOS Type Flash Memory using $Al_2O_3$ as Charge Trapping Layer," Fujitsu Laboratories Ltd, Date Unknown.

T. Saito, et al. "Hot Hole Erase Characteristics and Reliability in Twin MONOS Device" Halo LSI, Date Unknown.

Saifun Semiconductors, LTD. PowerPoint Presentation, Date Unknown.

Y. Roizin, et al. "Novel Techniques for data retention and Leff measurements in two bit MicroFlash® Memory Cells," Characterization and Metrology for ULSI Technology: 200 International Conf., pp. 181–185, Copyright 2001 American Institute of Physics, 1–56396–967–X/01.

W. J. Tsai, et al. "Cause of Data Retention Loss in a Nitride–Based Localized Trapping Storage Flassh Memory Cell," IEEE $40^{th}$ Annual International Reliability Physics Symposium, Dallas, (2002), pp. 34–38. Copyright 2002 IEEE.

W.J. Tsai, et al. "Data Retention Behavior of a SONOS Type Two–Bit Storage Flash Memory Cell," IEDM 01–1079–01–722, Copyright 2001 IEEE.

A. Shappir, et al., "Subthreshold slope degradation model for localized–charge–trapping based non–volatile memory devices," Solid–State Electronics 47 (2003), pp. 937–941. Copyright 2003 Elsevier Science Ltd.

R. Neale, "AMD's MirrorBit—a big step in Flash progress," Electronic Engineering Design, V. 74, No. 906, pp. 47–50.

I. Bloom, et al., "NROM™—a new technology for non-volatile memory products" Solid–State Electronics 46 (2002), pp. 1757–1763. Copyright 2002 Elsevier Science Ltd.

J. Bu and M. White, "Electrical characterization on ONO triple dielectric in SONOS nonvolatile memory devices," Solid–State Electronics 45 (2001) pp. 47–51. Copyright 2001 Elsevier Science Ltd.

Y. Kamigaki and S. Minami, "MNOS Nonvolatile Semiconductor Memory Technology: Present and Future," IEICE Trans. Electron, vol. E84–C, No. 6, pp. 713–723 (Jun. 2001).

E. Lusky, et al., "Electron Discharge Model of Locally–Trapped Charge in Oxide–Nitride–Oxide (ONO) Gates for NROM™ Non–Volatile Semiconductor Memory Devices," Extended Abstracts of the 2001 International Conference on Solid State Devices and Materials, Tokyo, 2001 pp. 534–535.

A. Nughin, "n–Channel 256kb and 1Mb EEPROMs" ISSCC91, Session 134, Special Session on Technology in the USSR, Paper 13.4, 1991 IEEE InternationalSolid State Circuits Conference, Digest of Technical Papers, pp. 228–229, 319.

G. Xue, et al., "Low Voltage Low Cost Nitride Embedded Flash Memory Cell" IMEC., Date Unknown.

L. Breuil, et al., "A new 2 isolated–bits/cell flash memory device with self aligned split gate structure using ONO stacks for charge storage," IMEC, Date Unknown.

J. Willer, et al., "UMEM: A U–shape Non–Volatile–Memory Cell," Ingentix GmbH &Co. KG., Infineon Technologies and Saifun Semiconductors, Date Unknown.

S. Kang, et al., "A Study of SONOS Nonvolatile Memory Cell Controlled Structurally by Localizing Charge–Trapping Layer," Samsung Electrons Co., Ltd., Date Unknown.

Y. Roizin, et al., "In–Process Charging in microFLASH® Memory Cells," Tower Semiconductor, Ltd., Date Unknown.

A. Shappir, et al., "Subthreshold slope degradation model for localized–charge–trapping based non–volatile memory devices," Solid State Electronics, 47 (2003) pp. 937–941, Copyright 2003 Elsevier Science Ltd.

I. Fujiwara, et al., "High speed program/erase sub 100 nm MONOS memory cell," Sony Corporation, Date Unknown.

E. Lusky, et al., "Investigation of Spatial Distribution of CHE Injection Utilizing the Subthreshold Slope and the Gate Induced Drain Leakage (GIDL) Characteristics of the NROM™ Device," Saifun Semiconductors, Ltd. and Tel Aviv University, Dept of Physical Electronics, pp. 1–2., Date Unknown.

C. C. Yeh, et al., "A Modified Read Scheme to Improve Read Disturb and Second Bit Effect in a Sealed MXVAND Flash Memory Cell," Macronix International Co., Ltd. and Department of Electronics Engineering, National Chiao–Tung University, Date Unknown.

Y. K. Lee, et al., "30–nm Twin Silicon–Oxide–Nitride–Oxide–Silicon (SONOS) Memory (TSM) with High Erase Speed and Reliability," School of Electrical Engineering, Seoul National University, C&M, System LSI, ATD, PD, Samsung Electronics Co., Date Unknown.

J. H. Kim, et al., "Highly Manufacturable SONOS Non-Volatile Memory for the Embedded SoC Solution," 2003 Symposium on VLSI Technology Digest of Technical Papers, pp. 31–32.

Y. Hayashi, et al., "Twin MONOS Cells with Dual Control Gates," 2000 Symposium on VLSI Technology Digest of Technical Papers, 2000 IEEE, pp. 122–123.

M. K. Cho and D. M. Kim, "High Performance SONOS Memory Cells Free of Drain Turn–On and Over–Erase: Compatibility Issue with Current Flash Technology," IEEE Electron Device Letters, vol. 21, No. 8, Aug. 2000, pp. 399–401, Copyright 2000 IEEE.

T. Y. Chan, K.K. Young and C. Hu, "A True Single–Transistor Oxide–Nitride–Oxide EEPROM Device," IEEE Electron Device Letters, vol. EDL–8, No. 3, Mar. 1987, pp. 93–95., Copyright 1987 IEEE.

I. Bloom, et al., "NROM™ NVM technology for MultiMedia Applications," Saifun Semiconductors, Ltd. Ingentix, Ltd. and Infineon Technologies, Date Unknown.

E. J. Prinz, et al., "An Embedded 90nm SONOS Flash EEPROM Utilizing Hot Electron Injection Programming and 2–Sided Hot Hole Injection Erase," Motorola Embedded Memory. Center, Date Unknown.

Y. Roizin, et al., "Retention Characteristics of microFLASH® Memory (Activation Energy of Traps in the ONO Stack)," Tower Semiconductor, Ltd., Date Unknown.

Y. Roizin, et al., "Activation Energy of Traps in the ONO Stack of microFLASH® Memory Cells," Tower Semiconductor, Ltd., Date Unknown.

Y. Roizin, et al., "'Dummy' Gox for Optimization of microFLASH® Technology," Tower Semiconductor, Ltd., Date Unknown.

Y. K. Lee, et al., "Multi–Level Vertical Channel SONOS Nonvolatile Memory on SOI," 2002 Symposium on VLSI Technology Digest of Technical Papers, Copyright 2002 IEEE.

T. Saito, et al., "CHE Program Behavior in MONOS Device," Halo LSI., Date Unknown.

J. Bu, et al., "Retention Reliability Enhanced SONOS NVSM with Scaled Programming Voltage," Microelectronics Lab., Date Unknown.

H. Tomiye, et al., "A novel 2–bit/cell MONOS memory device with a wrapped–control–gate structure that applies source–side hot–electron injection," 2002 Symposium on VLSI Technology Digest of Technical Papers, Copyright 2002 IEEE.

Certified Translation, "Flash cell that seeks to replace current technology introduced enabling both low cost and high performance" Nikkei Microdevices, Nov. 1999, pp. 147–148.

Cappelletti, P., et al., "Failure mechanisms of Flash Cell in Program/Erase Cycling", IEEE, 1994, IEDM–94, pp. 291–294.

Guan Huinan, et al., "On Scaling of SST Split–Gate Flash Memory Technologies", Department of Electrical and Computer Engineering, University of California, Irvine, Final Report 1998–1999 for MICRO Project 98–080.

Pavan, Paolo, et al., "Flash Memory Cells—An Overview", Proceedings of the IEEE, vol. 85, No. 8, Aug. 1997, pp. 1248–1271.

Seo, Jin–ho, et al., "Charge–to–Breakdown Characteristics of Thin Gate Oxide and Buried Oxide on SIMOX SOI Wafers", Journal of the Electrochemical Society, vol. 144, No. 1, Jan. 1997, pp. 375–378.

* cited by examiner

APPARATUS AND METHOD FOR SPLIT GATE NROM MEMORY

RELATED APPLICATIONS

This application is a continuation-in-part of U.S. patent application Ser. No. 10/612,725 filed on Jul. 1, 2003.

TECHNICAL FIELD

The present invention relates generally to semiconductor memory devices, and in particular to nitride read only memory transistor structures.

BACKGROUND OF THE INVENTION

Flash memory devices are high density, non-volatile memory devices having low power consumption, fast access times and low cost. Flash memory devices are thus well suited for use in a variety of portable electronic devices that require high-density storage but cannot support a disk drive, or other mass storage devices due to high power consumption or the additional weight of such devices. An additional advantage of flash memory is that it offers in-circuit programmability. A flash memory device may thus be reprogrammed under software control while the device resides on a circuit board within an electronic device.

FIG. 1 is a flash memory cell 10 according to the prior art. The flash memory cell 10 has a metal oxide semiconductor (MOS) structure that includes a substrate 12, a pair of source/drain regions 14, a floating gate 18 overlying a MOS channel region 16, and a control gate 20 overlying the floating gate 18. An oxide structure 22 separates the floating gate 18 from the channel region 16, and also separates the floating gate 18 from the control gate 20. For the device shown, the substrate 12 is doped with P-type impurities, and the source/drain regions 14 are doped with N-type impurities.

The memory cell 10 may be programmed by applying a sufficiently positive gate voltage $V_{CG}$ and a positive drain voltage $V_D$ to the device 10, while maintaining the source voltage $V_S$ at a zero, or ground potential. As charge is moved to the floating gate 18 from the source/drain region 14, the device 10 attains a logic state "0". Alternately, if little or no charge is present at the floating gate 18, a logic state corresponding to "1" is stored on the device 10.

To read the state of the device 10, a positive voltage $V_{CG}$ of predetermined magnitude is applied to the control gate 18, while $V_D$ is maintained positive. If the voltage applied to the control gate 18 is sufficient to turn the device 10 on, a current flows from one source/drain region 14 to the other source/drain region 14 that may be detected by other external circuits, thus indicating the logic state "1". Correspondingly, if sufficient charge exists at the floating gate 18 to prevent the device 10 from turning on, a logic state of "0" is read. A logic state may be erased from the device 10 by applying a positive source voltage $V_S$ to the source/drain region 14 while $V_{CG}$ is maintained at a negative potential. The device 10 attains a logic state "1" following an erase cycle.

Although the foregoing flash memory cell 10 is highly effective to store a logic state in a memory device, it has been observed that the programming efficiency of the memory cell 10 is degraded as the number of accumulated program/erase cycles increases. As a result, the cell 10 may fail after the number of program/erase cycles exceeds a limiting value, which is termed the endurance limit for the cell 10. Although the endurance limit is relatively unimportant in cases where the cell 10 is programmed only once, it may be a critical concern where the device 10 is erased and reprogrammed numerous times. The degradation of the programming efficiency is believed to result from hot electrons that become trapped in the relatively thin oxide layer separating the floating gate 18 from the substrate 12 during a programming cycle, which permanently damages the oxide layer. In addition, extremely high electric field strengths are generated during erase cycles that cause holes having relatively low momentum to become trapped in the oxide layer separating the floating gate 18 and the substrate 12. As the cell 10 is subjected to repeated program/erase cycles, the trapped holes accumulate in the oxide layer and thus cause the electric fields applied during a read cycle to be degraded.

The qualitative effects of degradation of the flash memory cell 10 are shown in FIGS. 2–4. FIG. 2 compares the performance of a non-cycled flash memory cell 10 with the performance of the cell 10 after it has been subjected to a substantial number of erase and programming cycles. As shown in FIG. 2, the source/drain current $I_{DS}$ for the cycled cell 10 is significantly lower that that obtained from a non-cycled cell 10 for a comparable fixed control gate voltage $V_{CG}$. As a consequence, the determination of a logic state during a read cycle is adversely affected due to the lowered source/drain current in the cycled cell 10. This effect is further shown in FIG. 3, where the source/drain current $I_{DS}$ of the cell 10 is observed to steadily decrease as the number of cycles accumulates on the cell 10. FIG. 3 also shows that the endurance limit for the cell 10 may occur between approximately 105 and 106 cycles.

FIG. 4 shows the variation of a threshold voltage $V_T$ for the cell 10 as the number of program/erase cycles is increased. The threshold voltage $V_T$ is defined as the minimum required voltage to turn on a cell 10 during a read cycle. In FIG. 4, $V_{T,1}$ corresponds to the threshold value required to turn on the cell 10 when the floating gate of the cell 10 is charged (indicating logic state "0"), while $V_{T,2}$ corresponds to the threshold value required to turn on the cell 10 when the floating gate 18 is not charged. The difference between the $V_{T,1}$ and $V_{T,2}$ values thus defines a threshold voltage "window", as shown in FIG. 4. As the cell 10 is subjected to cycling, the "window" becomes progressively smaller, so that it becomes more difficult to distinguish between the two logic states stored in the cell 10.

One prior art solution to the foregoing endurance limit problem is a flash memory cell having a floating gate asymmetrically positioned towards the source, with the control gate overlying the floating gate and also directly overlying the channel region of the cell, as disclosed in detail in an article by P. Pavan, et al., entitled *Flash Memories-An Overview*, IEEE Proceedings, vol. 85, No. 8, pp. 1248–1271, 1997. Since the programming and erase functions occur in the portion of the channel region adjacent to the source, damage to the gate oxide is limited to only a portion of the channel region. Although the foregoing flash memory cell arrangement achieves some increase in the endurance limit, the damage to the oxide layer underlying the floating gate eventually becomes excessive, so that it is no longer possible to read the logic state stored in the cell.

Another prior art flash memory cell includes a source region that is surrounded by an N-region to further protect the source junction of the cell from the large electric field strengths that arise when the cell is erased. One significant drawback present in this configuration is that the source and drain regions may not be interchanged to extend the endurance of the cell. Further, the asymmetrical arrangement adds to the overall fabrication costs of the flash memory device.

Recently developed nitride read only memory (NROM) devices employ charge trapping in a silicon nitride layer in a non-conventional flash memory device structure. The lateral spread of charge stored in the oxide-nitride-oxide (ONO) layer compromises the ability to scale down the device's dimensions. Additionally, planar memory cells require a relatively greater area for each cell than vertical devices. There is a resulting need in the art for a flash memory device that combines the benefits of NROM cells with the benefits of vertical memory cells.

SUMMARY

The present invention encompasses a vertical NROM memory cell. The cell comprises a plurality of oxide pillars that each has a source/drain region formed in the top of the pillar. A trench is formed between each pair of oxide pillars.

A control gate is formed in the trench between the pair of oxide pillars. A program gate is formed between the control gate and each oxide pillar. The program gates extend along the sidewall of each oxide pillar.

A gate insulator layer is formed between each program gate and the adjacent oxide pillar. Each gate insulator layer has a structure for trapping at least one charge. In one embodiment, the gate insulator structure is an oxide-nitride-oxide layer in which the charge is stored at the trench bottom end of the nitride layer.

DETAILED DESCRIPTION

The present invention is generally directed to semiconductor memory devices, and in particular to floating gate transistor structures used in non-volatile semiconductor memory devices such as flash memory devices. Many of the specific details of certain embodiments of the invention are set forth in the following description and in FIGS. 5–17 to provide a thorough understanding of such embodiments. One skilled in the art will understand, however, that the present invention may be practiced without several of the details described in the following description. Moreover, in the description that follows, it is understood that the figures related to the various embodiments are not to be interpreted as conveying any specific or relative physical dimension. Instead, it is understood that specific or relative dimensions related to the embodiments, if stated, are not to be considered limiting unless the claims expressly state otherwise.

Figure 1:
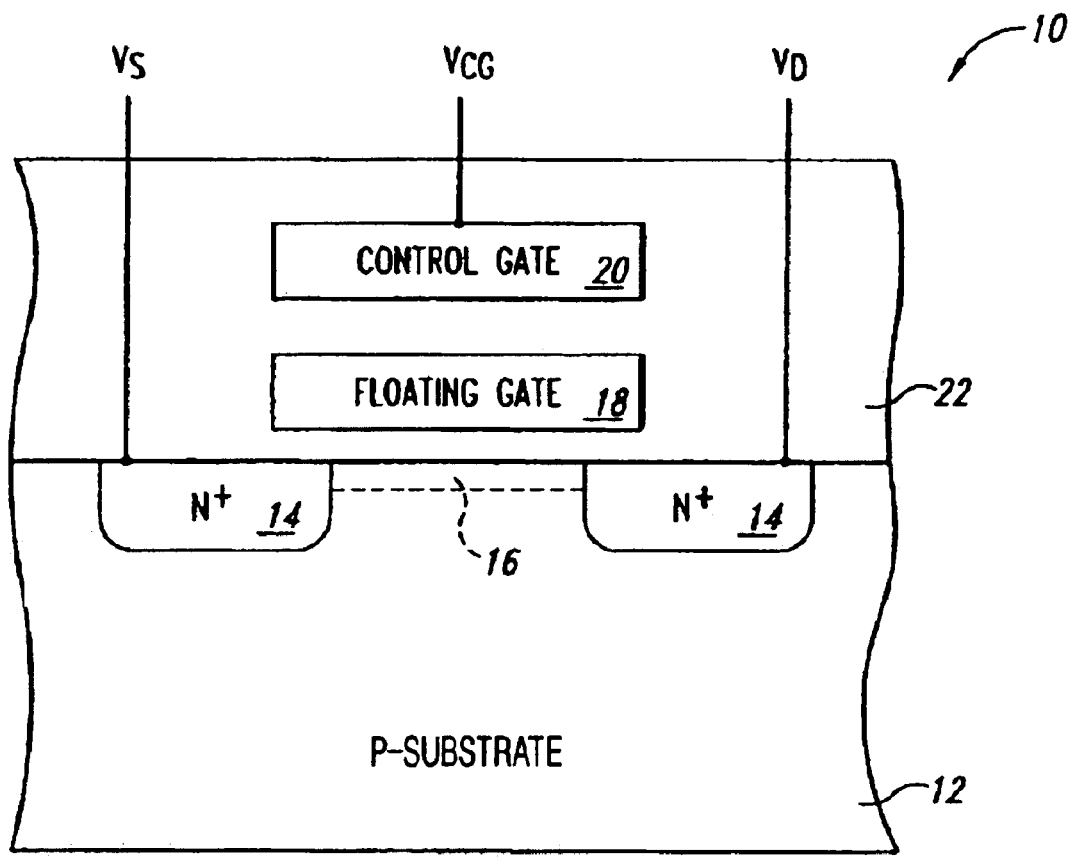
FIG. 1 is a cross sectional view of a flash memory cell according to the prior art.
Figure 2:
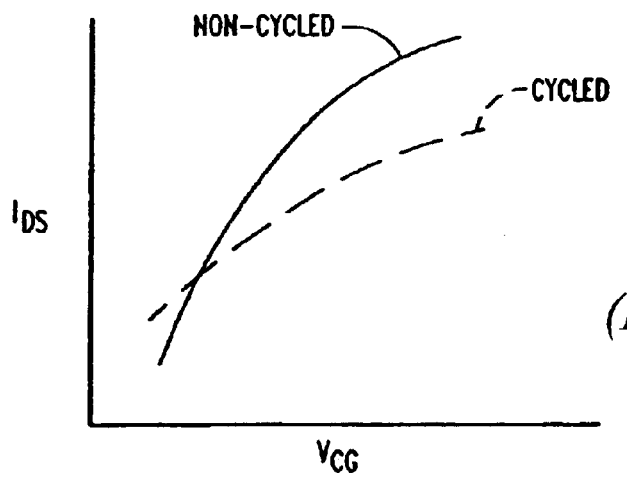
FIG. 2 is a graph that qualitatively compares the drain/source current performance for a cycled and a non-cycled flash memory cell.
Figure 3:
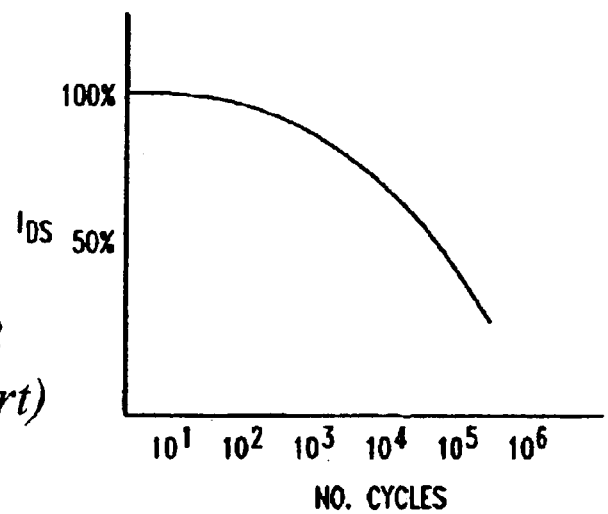
FIG. 3 is graph that qualitatively illustrates the degradation of the drain/source current performance as the number of cycles is increased for a flash memory cell.
Figure 4:
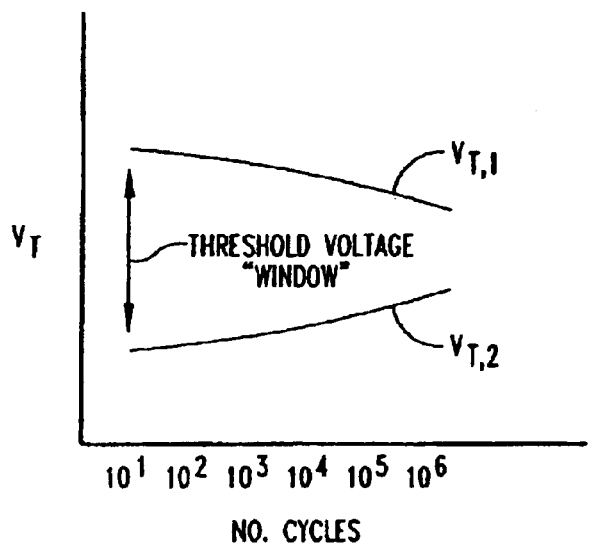
FIG. 4 is graph that qualitatively illustrates the narrowing of the voltage threshold window of a flash memory cell as the number of cycles is increased.
Figure 5:
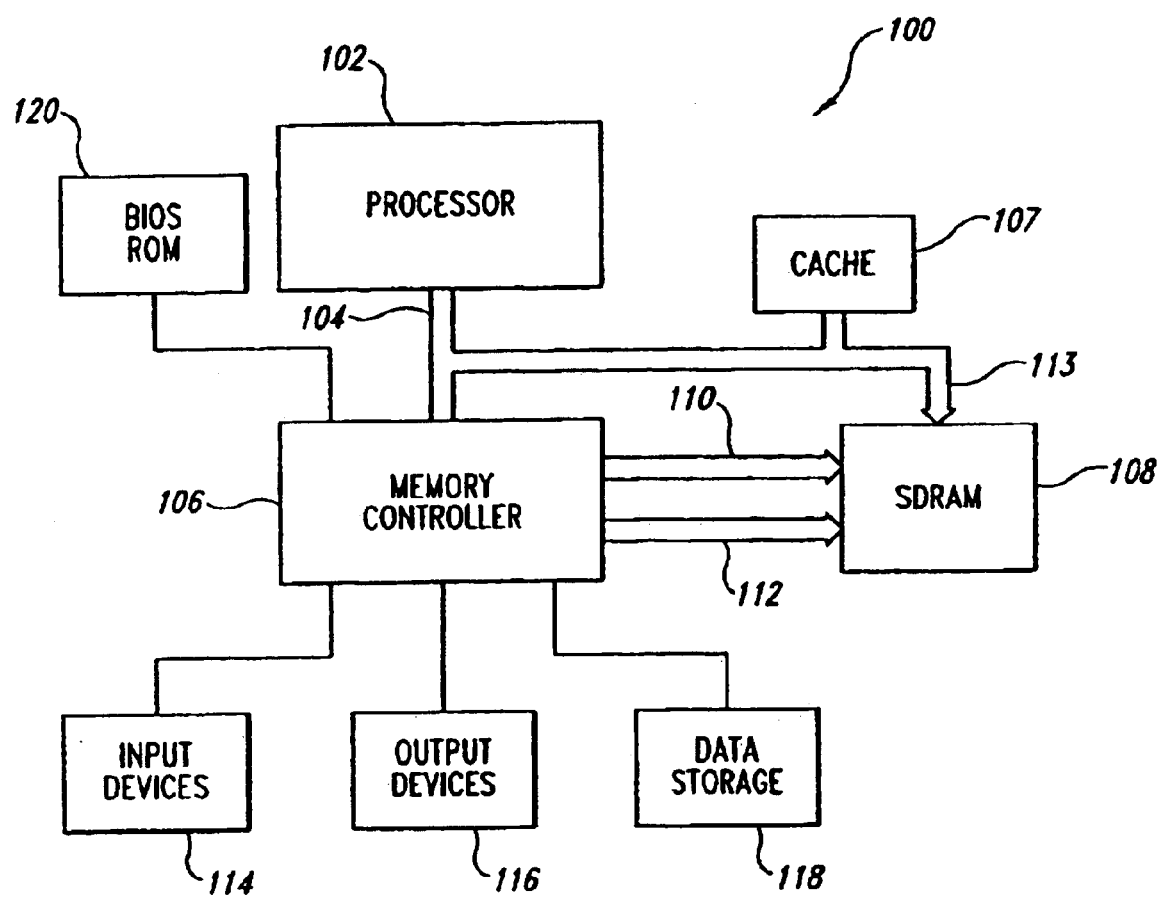
FIG. 5 is a block diagram of a computer system 100 according to an embodiment of the invention.

FIG. 5 shows an embodiment of a computer system 100 that may use the memory device of FIGS. 6–17 or some other embodiment of a memory device according to the present invention. The computer system 100 includes a processor 102 for performing various computing functions, such as executing specific software to perform specific calculations or tasks. The processor 102 includes a processor bus 104 that normally includes an address bus, a control bus, and a data bus. The processor bus 104 is coupled to a memory controller 106, which is, in turn, coupled to a number of other components. The processor 102 is also typically coupled through the processor bus 104 to a cache memory 107, which is usually a static random access memory ("SRAM") device.

The memory controller 106 is coupled to system memory in the form of a synchronous dynamic random access memory ("SDRAM") device 108 through an address bus 110 and a control bus 112. An external data bus 113 of the SDRAM device 108 is coupled to the data bus of the processor 102, either directly or through the memory controller 106.

The memory controller 106 is also coupled to one or more input devices 114, such as a keyboard or a mouse, to allow an operator to interface with the computer system 100. Typically, the computer system 100 also includes one or more output devices 116 coupled to the processor 102 through the memory controller 106, such output devices typically being a printer or a video terminal. One or more data storage devices 118 are also typically coupled to the processor 102 through the memory controller 106 to store data or retrieve data from external storage media (not shown). Examples of typical storage devices 118 include hard and floppy disks, tape cassettes, and compact disk read-only memories (CD-ROMs).

Finally, the memory controller 106 is coupled to a basic input-output ("BIOS") read only memory ("ROM") device 120 for storing a BIOS program that is executed by the processor 102 at power-up. The processor 102 may execute the processor 102 either directly from the BIOS ROM device 120 or from the SDRAM device 108 after the BIOS program has been shadowed by transferring it from the BIOS ROM device 120 to the SDRAM device 108. The BIOS ROM device 120 is preferably a non-volatile memory device according to the present invention, such as the embodiments of the invention shown in the memory device of FIGS. 6–17. Such embodiments include a nitride read only memory (NROM) device.

NROM has some of the characteristics of flash memory but does not require the special fabrication processes of flash memory. NROM can be implemented using a standard CMOS process. Because of NROM's compatibility with the CMOS process, an NROM memory device can be embedded into other architectures, such as microcontrollers, that also use the CMOS process.

NROM technology can incorporate both a single bit/cell and two bits/cell. The charge or charges are stored on a layer of silicon nitride. The nitride layer can be patterned in small pieces matching the size of each individual NROM cell. In one embodiment, the split transistor memory of the present invention is implemented using NROM technology as will be discussed subsequently.

Figure 6:
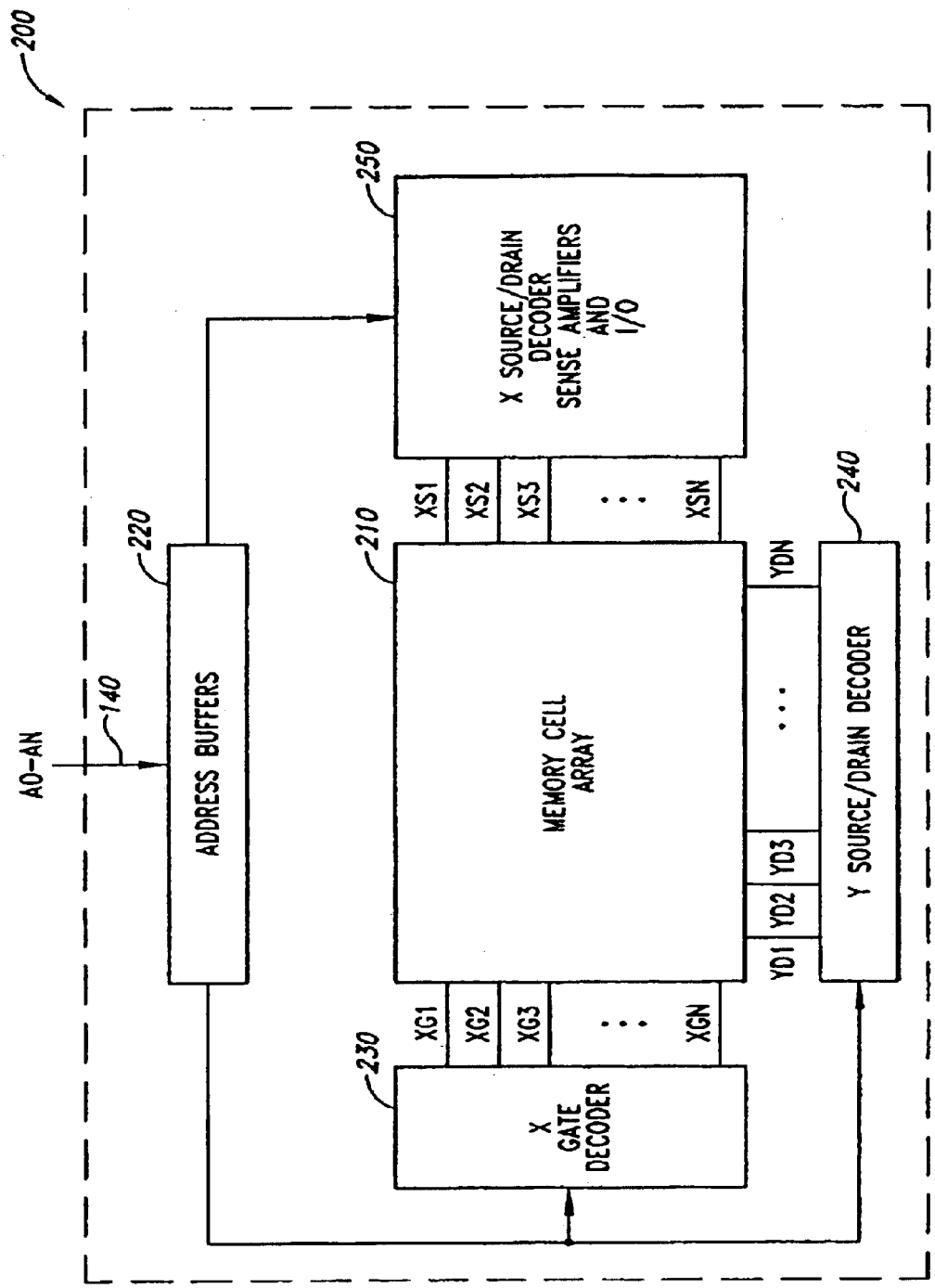
FIG. 6 is a block diagram of a memory device according to another embodiment of the present invention.

FIG. 6 is a block diagram of a memory device 200 according to an embodiment of the present invention, which may comprise at least a portion of the memory 108 shown in FIG. 5. The memory device 200 includes a memory cell array 210 that includes memory cells comprised of floating gate FET transistor devices as will be described in greater detail below. The memory device 200 also includes an x-gate decoder 230 that provides a plurality of gate lines XG1, XG2 ... XGN for addressing the cells in the memory cell array 210. A y-source/drain decoder 240 provides a plurality of source/drain lines YD1, YD2 ... YDN for accessing the first source/drain regions of the floating gate FET transistor cells in the array 210. An x-source/drain decoder 250 similarly provides a plurality of data lines XS1, XS2 ... XSN for accessing second source/drain regions of the cells in the memory array 210. The x-source/drain decoder 250 may also include sense amplifiers and input/output (I/O) devices for reading, writing or erasing data from the memory cell array 210. The memory device 200 further includes address buffers 220 that receive address signals A0 ... AN from the address bus 140 (as shown in FIG. 5). The address buffers 220 are coupled to the x-gate decoder 230, the y-source/drain decoder 240 and the x-source/drain decoder 250 to control the reading, writing and erasing operations on the memory cells in the memory cell array 210.

Figure 7:
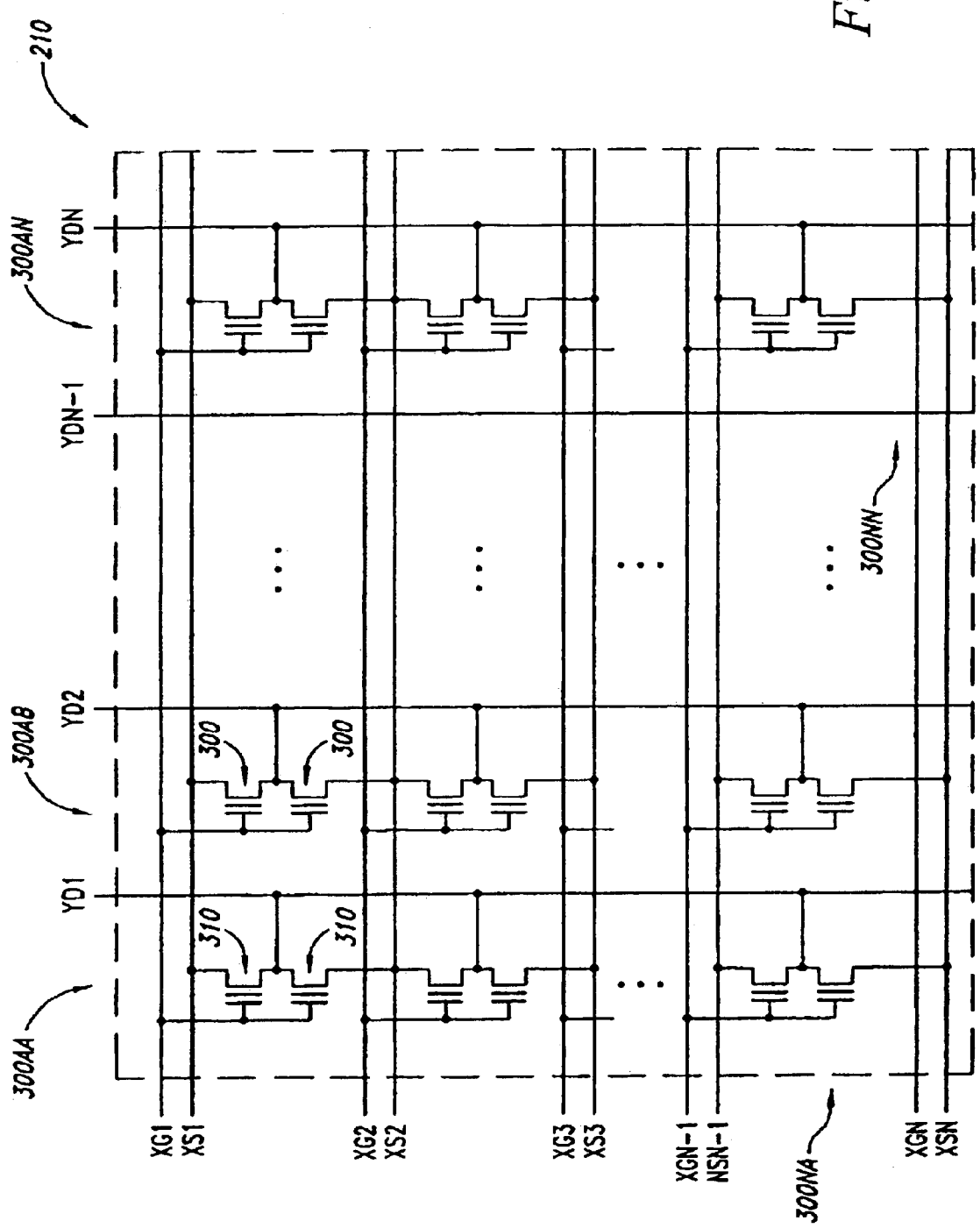
FIG. 7 is a schematic diagram of a memory cell array according to an embodiment of the invention.

FIG. 7 is a partial schematic diagram illustrating an embodiment of the memory cell array 210, as shown in FIG. 6. The memory cell array 210 includes a plurality of adjacent and interconnected memory cells 300 of substantially similar configuration that extend in a first direction along a row of the array 210 from a cell 300AA to a cell 300AN. The array further extends in a second direction to a row 300 NA that further extends in the first direction to a cell 300NN. Each of the memory cells 300AA through 300NN includes a pair of field effect transistors (FETs) 310 having an electrically isolated floating gate that controls the conduction between the source and drain regions in the FETs 310. The FETs 310 in each of the cells 300AA to 300 NN share a common gate, such as XG1, XG2 ... XGN, and are formed in columnar structures, as described in greater detail below.

Figure 8:
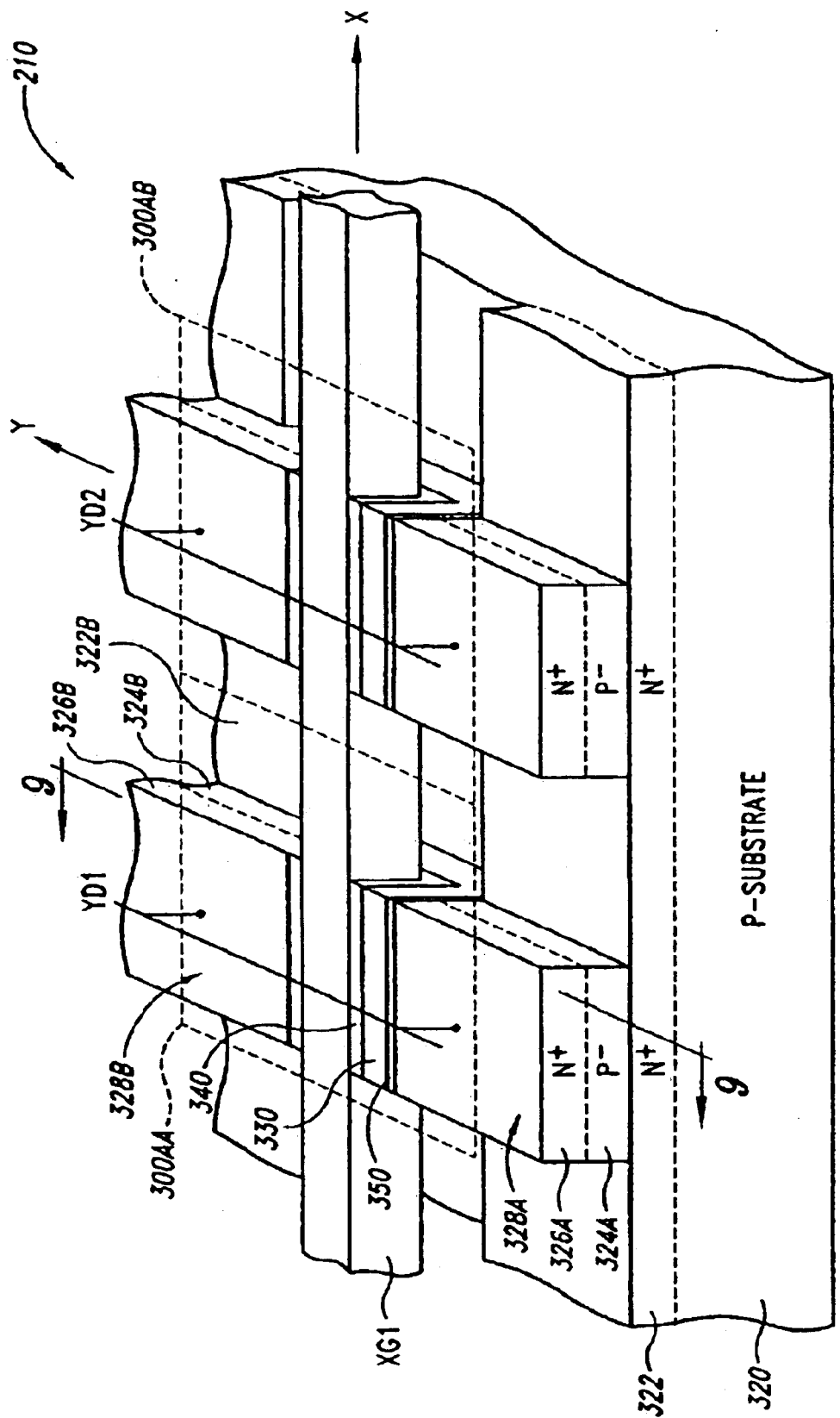
FIG. 8 is an isometric view of a portion of a memory cell array according to an embodiment of the invention.

FIG. 8 is a partial isometric view illustrating a portion of the memory cell array 210 of FIG. 7. For clarity of illustration, only memory cells 300AA and 300AB of the array 210 are shown, and in the following description, only memory cell 300AA will be described. It is understood, however, that the array 210 includes a substantial number of cells having a substantially similar structure, so that the array 210 extends in a first direction (the "x" direction, as shown in FIG. 8), and also in a second direction (the "y" direction, also as shown in FIG. 8) that is substantially perpendicular to the first direction. The cell 300AA includes a pair of columnar structures 328A and 328B formed on a p-type substrate 320. Each of the columnar structures 328 includes a first source/drain region 322 comprised of a material having an N+ conductivity that extends along the substrate 320 in the x-direction. The structures 328A and 328B further include a second source/drain region 326 also having an N+ conductivity that is positioned adjacent to the first source/drain region 322. A separation layer 324 of material doped to have a conductivity of P− is interposed between the first source/drain region 322 and the second source/drain region 328.

Still referring to FIG. 8, the columnar structures 328A and 328B are spaced apart to permit the gate line XG1 to be positioned between the structures 328A and 328B. A floating gate 330 is interposed between the structure 328A and the gate line XG1, and between the structure 328B and the gate line XG1. The floating gate 330 further extends below the gate line XG1 so that the floating gate 330 is also interposed between the gate line XG1 and the underlying substrate 320 to form a single control gate 330 between the structures 328A and 328B. The floating gate 330 is electrically isolated from the gate line XG1 by a first dielectric layer 340 that is interposed between the gate line XG1 and the floating gate 330. The floating gate 330 is further electrically isolated from the first structure 328A and the second structure 328B by a second dielectric layer 350 interposed between the floating gate 330 and the structures 328A and 328B. The floating gate 330 is further positioned between the first structure 328A and the second structure 328B so that the floating gate 330 is positioned closer to the first structure 328A than to the second structure 328B, as will be shown in greater detail below. Accordingly, a portion of the second dielectric 350 that is substantially adjacent to the first structure 328A is thinner than a corresponding portion of the second dielectric 350 that is adjacent to the second structure 328B. One skilled in the art will recognize, however, that the thinner portion of the second dielectric 350 may be positioned adjacent to the second structure 328B, while a thicker portion of the second dielectric 350 is positioned adjacent to the first structure 328A. The floating gate 330 may be comprised of a polysilicon material that is deposited on the array 210 during a fabrication process, as will also be described in greater detail below. The first dielectric layer 340 and the second dielectric layer 350 may be comprised of silicon dioxide that is grown or deposited during the fabrication of the array 210, although other similar dielectric materials may also be used.

The second source/drain region 326A of the first structure 328A and the second source/drain region 326B of the second structure 328B are interconnected by a data line YD1 that is comprised of a metallic or other interconnection line that is substantially electrically isolated from the underlying topology of the array 210. Accordingly, it is understood that the array 210 as shown in FIG. 8 may be overlaid by a layer of a dielectric material (not shown) that includes contact penetrations that are etched in the dielectric material in order to permit the data line YD1 to be connected to the first structure 328A and the second structure 328B.

Figure 9:
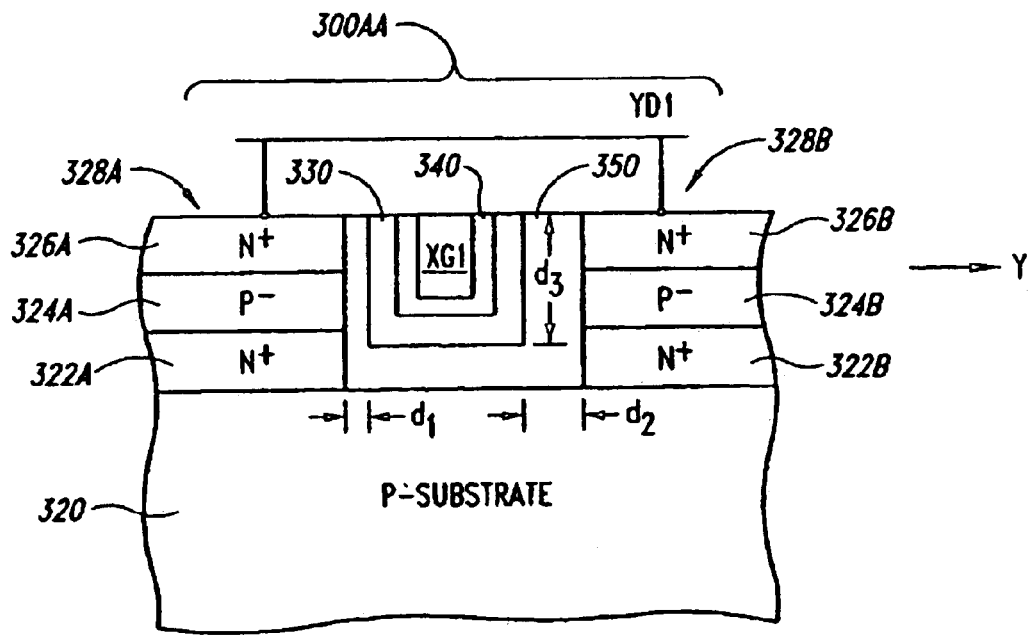
FIG. 9 is a cross sectional view of a memory array according to an embodiment of the invention.

FIG. 9 is a partial cross sectional view of the memory array 210 that is viewed from the section line 9—9 of FIG. 8, and thus viewed generally parallel to the x-direction shown in FIG. 8. As noted above, the floating gate 330 is separated from the first structure 328A and the second structure 328B by dissimilar thicknesses of the second dielectric layer 350. Accordingly, the first structure 328A is spaced apart from the floating gate 330 by a first distance d1, and the second structure 328B is spaced apart from the floating gate 330 by a second distance d2, where the first distance d1 is less than the second distance d2. In a particular embodiment, the second distance d2 is approximately two times the thickness of the first distance d1. In another particular embodiment, the floating gate 330 has a height d3 of approximately about 0.1 μm, and is spaced apart from the first and second structures 328A and 328B by a first distance d1 of approximately 33 Å and a second distance d2 of approximately 66 Å. The present invention is not limited to any particular distances for d1 and d2.

Figure 10:
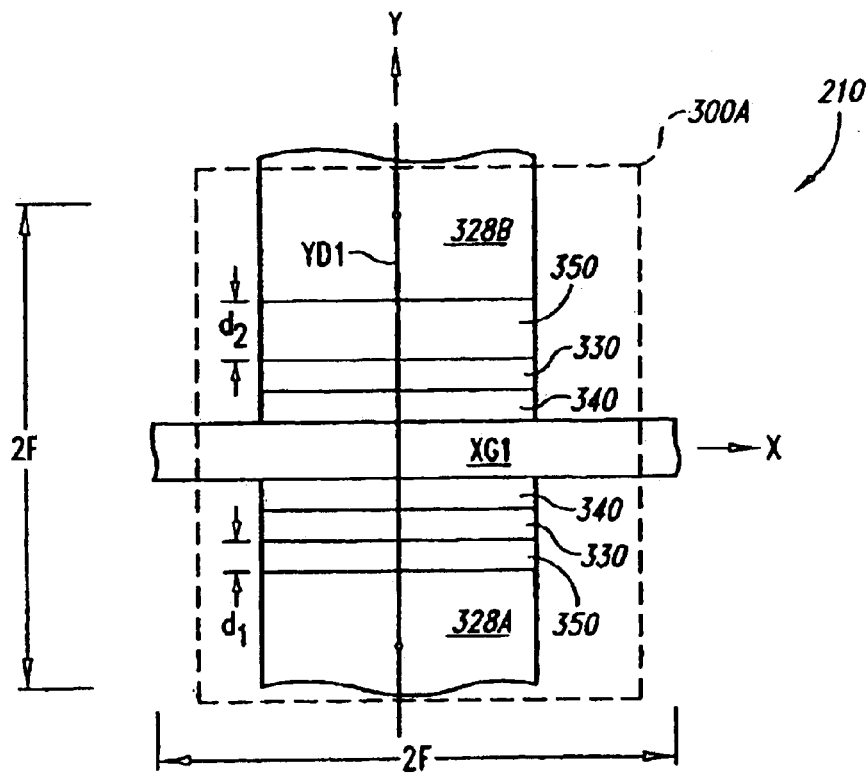
FIG. 10 is a plan view of a memory array according to an embodiment of the invention.

FIG. 10 is a partial plan view of the memory array 210 shown in FIG. 9. In particular, the cell 300AA has a pitch that extends in the y-direction of approximately 2F, and a pitch that extends in the x-direction approximately 2F, where F is characteristic dimension associated with a minimum lithographic feature size. Accordingly, a logic state corresponding to a single data bit may be advantageously stored in an area of approximately 4F2. This compares favorably with a feature size of 8F2 for the well-known folded array architecture commonly found in DRAM memory arrays.

The foregoing embodiment provides still other advantages over the prior art. For example, and with reference again to FIG. 9, since programming and erase functions are performed on the first structure 328A that is spaced apart from the floating gate 330 by a generally thinner portion of the dielectric layer 350, charge trapping in the thinner oxide layer will have only a minor effect on the opposing second structure 328B that is positioned adjacent to a generally thicker portion of the dielectric layer 350 during read operations.

Figure 11:
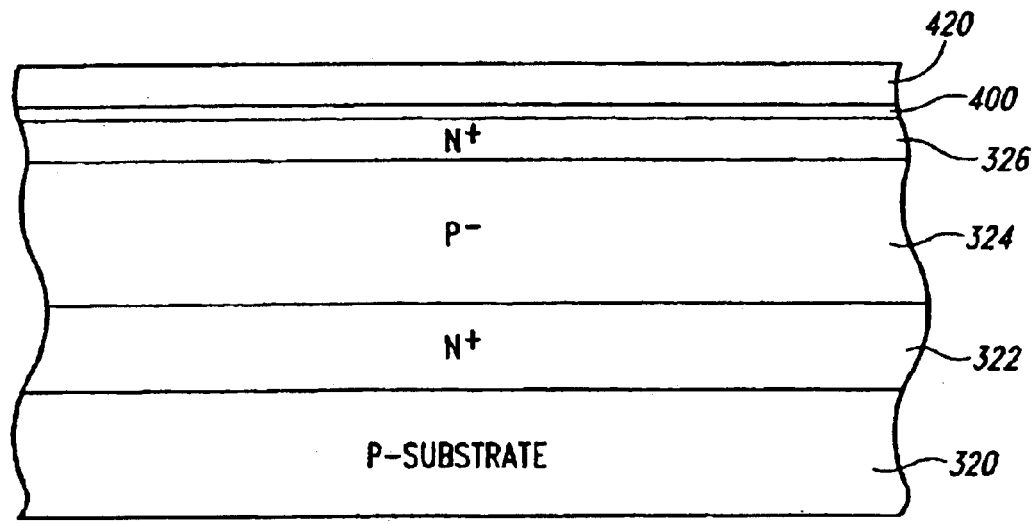
FIG. 11 is a cross sectional view that illustrates a step in a method for forming a memory array according to another embodiment of the invention.

FIGS. 11–16 are partial cross sectional views that illustrate steps in a method for forming a memory array according to another embodiment of the invention. Referring first to FIG. 11, a substrate 320 formed from silicon and doped to a P-conductivity is used as a starting material. A first source/drain region 322 is formed on the substrate 320. The region 322 may be formed on the substrate 320 by ion implantation or other similar processes in order to attain the desired N+ conductivity. Alternately, an epitaxial layer of N+ silicon may be grown on a surface of the substrate 320. A separation layer 324 may then be formed on the first source/drain region 322 by an epitaxial growth of P– silicon to a desired thickness. A second source/drain layer 326 may be formed on the separation layer 324 by another epitaxial growth of N+ silicon. A pad layer 400 comprised of silicon oxide may be formed on an exposed surface of the second source/drain layer 326, which may be overlaid by a pad layer 420, comprised of silicon nitride.

Figure 12:
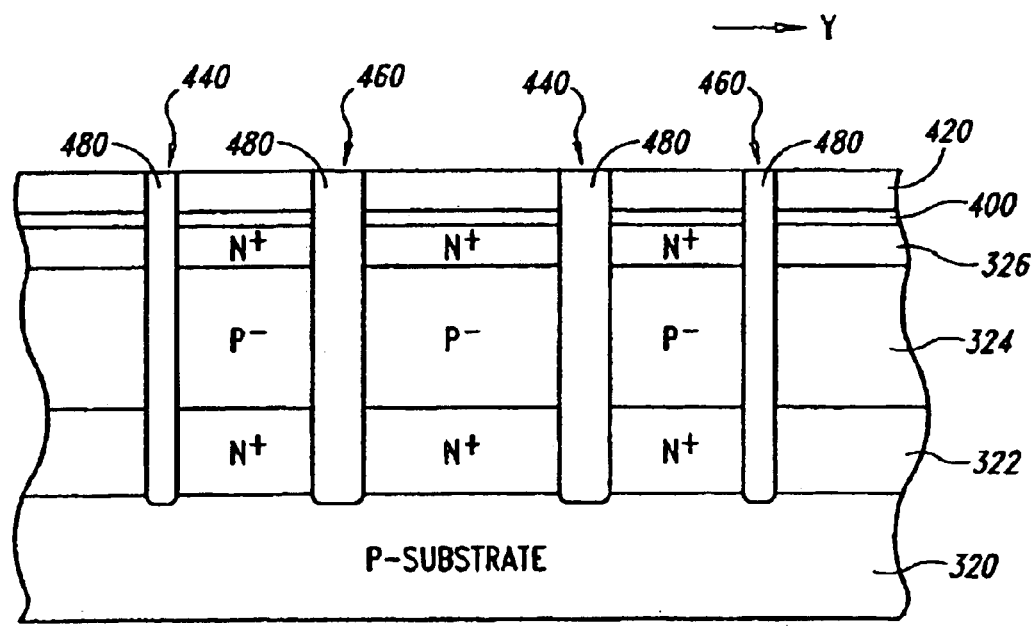
FIG. 12 is a cross sectional view that illustrates a step in a method for forming a memory array according to another embodiment of the invention.

Turning now to FIG. 12, a plurality of first trenches 440 and a plurality of second trenches 460 are formed in the structure shown in FIG. 11. The first trenches 440 and the second trenches 460 are formed in the structure of FIG. 11 in a direction that is approximately perpendicular to the y-direction. The trenches 440 and 460 are substantially mutually parallel. The first trenches 440 and the second trenches 460 project downwardly into the structure to the p-substrate layer 320. The first trenches 440 and the second trenches 460 may be formed by patterning an exposed surface of the structure shown in FIG. 11 with a layer of photoresist (not shown in FIG. 12) to form an etch barrier having exposed surface portions that coincide with the intended locations of the first trenches 440 and the second trenches 460. The substrate material underlying the exposed surface portions may be removed by plasma etch methods, or by wet etching method known in the art.

Figure 13:
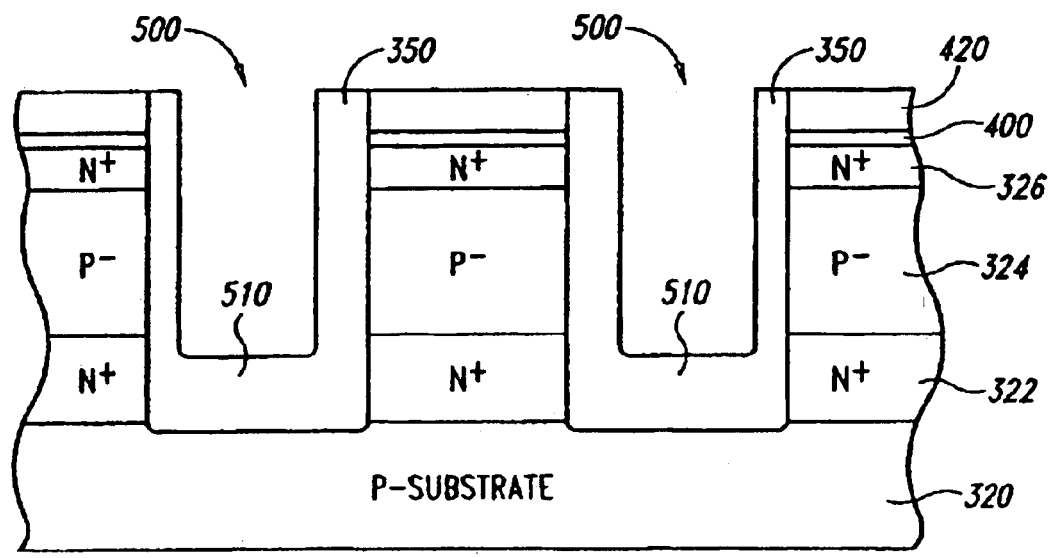
FIG. 13 is a cross sectional view that illustrates a step in a method for forming a memory array according to another embodiment of the invention.

Still referring to FIG. 12, the first trenches 440 and the second trenches 460 are substantially filled with silicon dioxide 480 that is grown in the first trenches 440 and second trenches 460 through an oxidation process, or deposited in the first trenches 440 and second trenches 460 by other well-known methods. The material positioned between the first trenches 440 and the second trenches 460 (as shown in FIG. 12) is removed by forming another etch stop layer of photoresist (not shown) and removing the material by wet or plasma etch methods to form voids 500, as shown in FIG. 13. A bottom portion 510 comprising a silicon dioxide material is formed by oxidation, or other well-known deposition processes to form the second dielectric layer 350.

Figure 14:
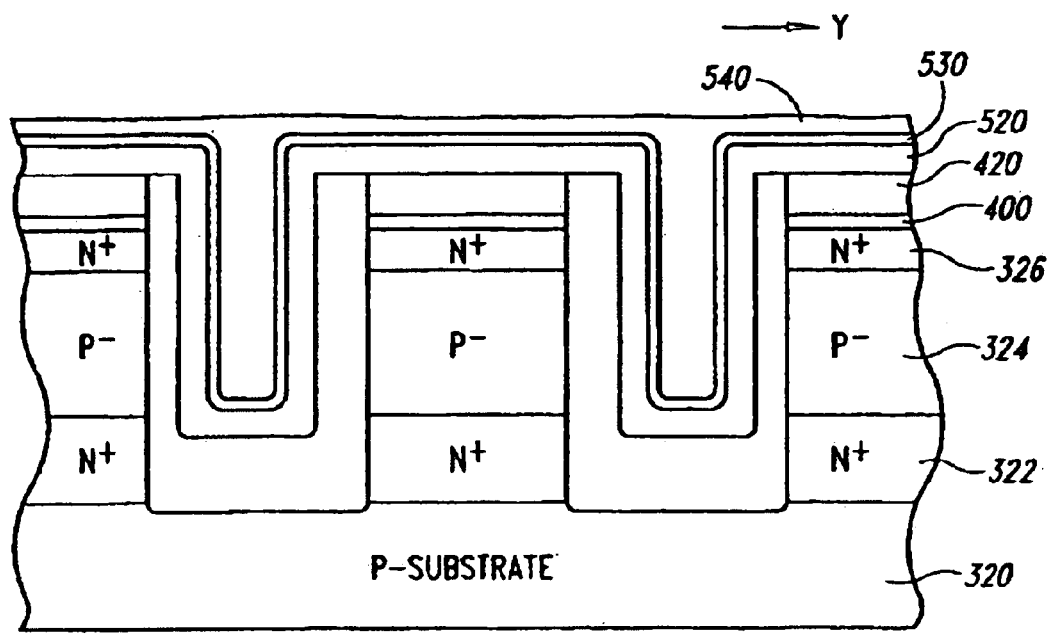
FIG. 14 is a cross sectional view that illustrates a step in a method for forming a memory array according to another embodiment of the invention.

Referring now to FIG. 14, a polysilicon layer 520 is formed on the structure of FIG. 13, which extends downwardly into each of the voids 500 of FIG. 13. The polysilicon layer 520 may be deposited on the structure by various well-known methods. An oxide layer 530 is then formed on the polysilicon layer 520 by exposing the polysilicon layer 520 to an oxidation process. A polysilicon or metal layer 540 may then be formed over the oxide layer 530 by various well-known polysilicon or metal deposition methods.

Figure 15:
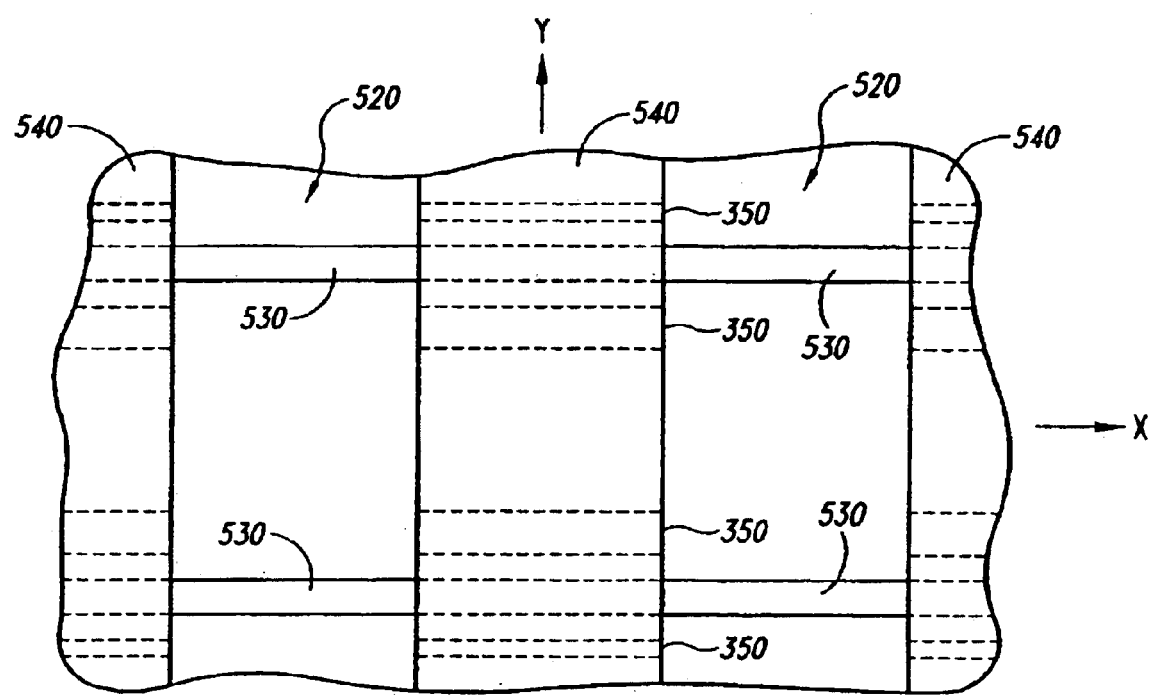
FIG. 15 is a plan view that illustrates a step in a method for forming a memory array according to another embodiment of the invention.
Figure 16:
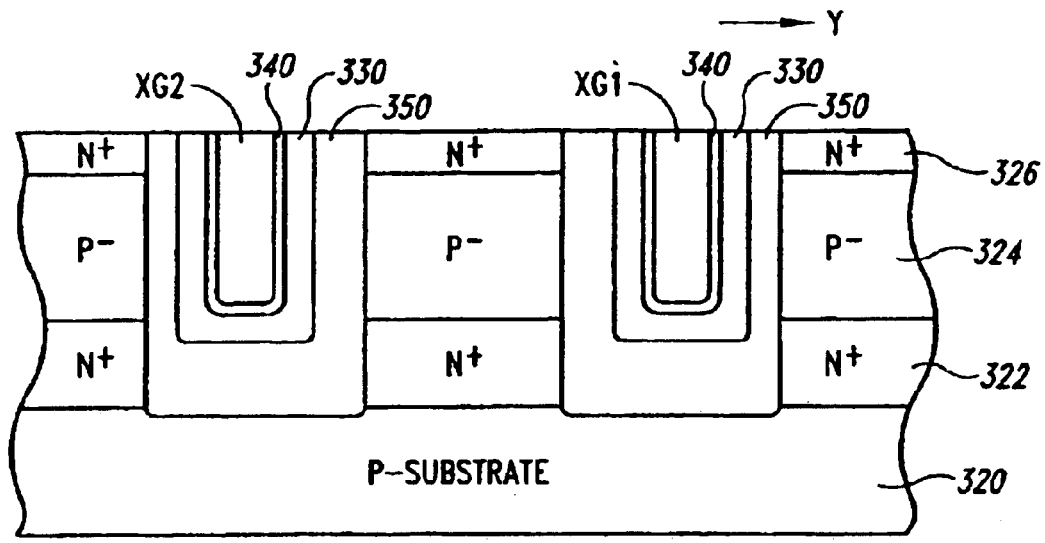
FIG. 16 is a cross sectional view that illustrates a step in a method for forming a memory array according to another embodiment of the invention.

FIG. 15, is a partial plan view that illustrates the formation of a plurality of substantially parallel grooves 520 that extend in the y-direction. The grooves 520 are formed by selectively etching the structure shown in FIG. 14, so that the polysilicon or metallic interconnections 530 extend across the grooves 520. The interconnections 530 form the gate lines XG1, XG2 . . . XGN as described in detail in connection with FIGS. 8–10. The polysilicon layer 520, the oxide layer 530 and the polysilicon or metal layer 540 may then be removed from the upper surfaces 540, as shown in greater detail in FIG. 16. The layers 520, 530 and 540 may be removed using chemical mechanical planarization.

Figure 17:
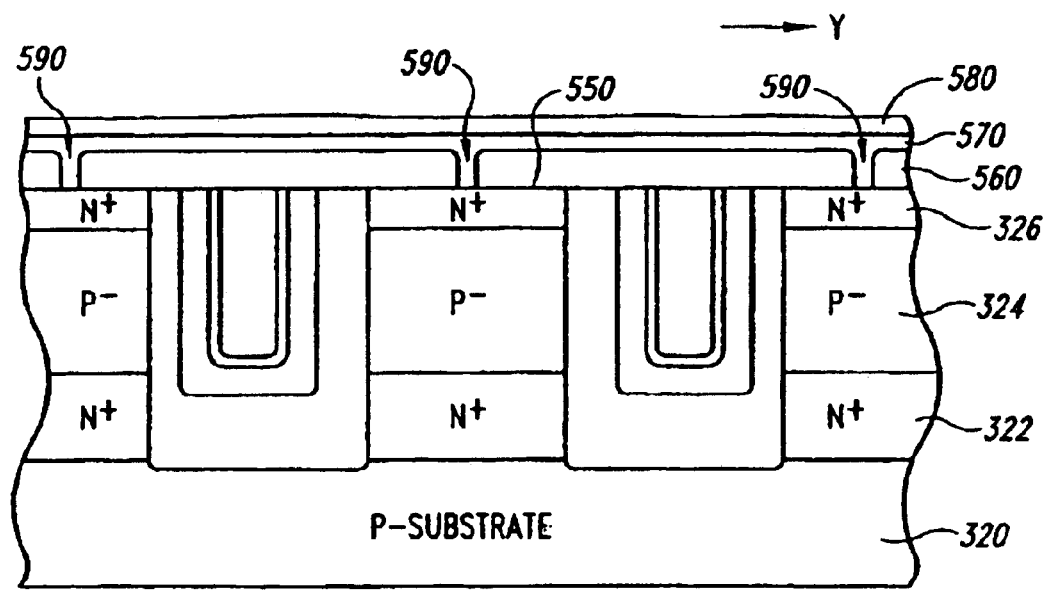
FIG. 17 is a cross sectional view that illustrates a step in a method for forming a memory array according to another embodiment of the invention.

Turning to FIG. 17, a surface oxide layer 550 may be deposited on a surface 550 and patterned using a photoresist (not shown) to form an etch-stop layer to form a plurality of protrusions 590 that extend through the surface oxide layer 550 to the second source/drain regions 326. A metal layer 570 is then deposited on the surface oxide layer 550 that extends downwardly into each of the protrusions 590 to electrically couple the second source/drain regions 326, forming the data lines YD1, YD2 . . . YDN described in detail in connection with FIGS. 8–10.

The embodiments of the split gate NROM cells of the present invention provide the non-volatile storage benefits of flash memory cells with the space saving benefits of vertical memory cells. Additional benefits include multiple charge storage locations.

Figure 18:
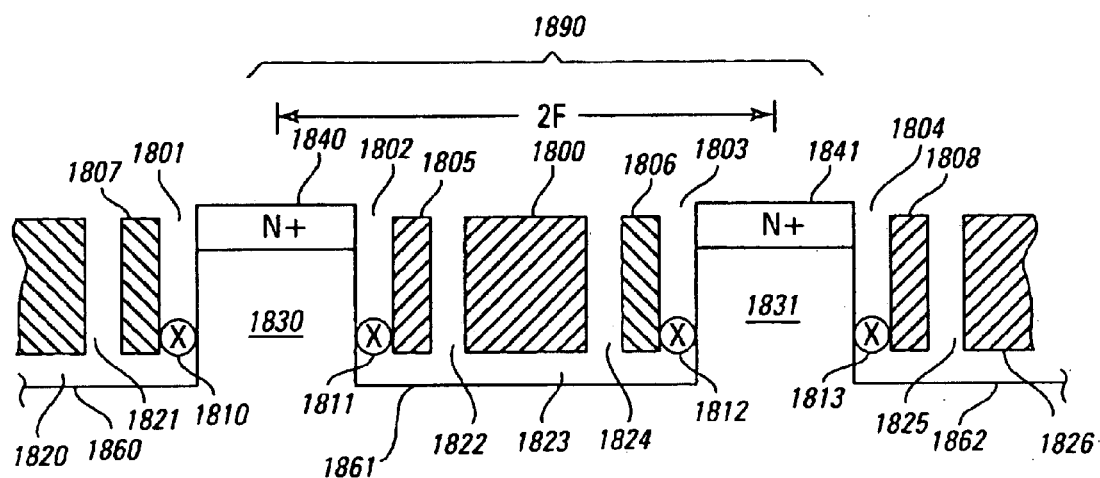
FIG. 18 is a cross sectional view of a vertical NROM memory cell embodiment incorporating the split gate of the present invention.

FIG. 18 illustrates a cross sectional view of a vertical NROM cell embodiment incorporating the split gate embodiment of the present invention. A cell is comprised of one polysilicon control gate 1800 and two polysilicon split program gates 1805 and 1806 along the sides of the two oxide pillars 1830 and 1831. FIG. 18 illustrates a memory cell 1890 as well as portions of other cells in a memory array.

A vertical split gate NROM cell is additionally comprised of gate insulator layers 1801–1804 formed between the program gates 1805–1808 and the oxide pillars 1830 and 1831. In one embodiment, the gate insulators 1801–1804 are a composite structure of oxide-nitride-oxide (ONO).

Alternate embodiments use other gate insulators besides the ONO structure shown. These structures include oxide-nitride-aluminum oxide composite layers, oxide-aluminum oxide-oxide composite layers, oxide, silicon oxycarbide-oxide composite layers as well as other composite layers.

In still other alternate embodiments, the gate insulator could include thicker than normal silicon oxides formed by wet oxidation and not annealed, silicon rich oxides with inclusions of nanoparticles of silicon, silicon oxynitride layer that are not composite layers, silicon rich aluminum oxide insulators that are not composite layers, silicon oxycarbide insulators that are not composite layers, silicon oxide insulators with inclusions of nanoparticles of silicon carbide, in addition to other non-stoichiometric single layers of gate insulators of two or more commonly used insulator materials such as Si, N, Al, Ti, Ta, Hf, Zr, and La.

The cell of FIG. 18 is additionally comprised of conventional silicon oxide insulators as interpoly insulators 1821, 1822, 1824, and 1825 between the program gates 1805–1808 and their respective control gates. The conventional oxide insulator material, in one embodiment, is also used at the bottom 1820, 1823, and 1826 of the trenches 1860–1862. The charge storage locations 1810–1813 in the gate insulator layers are indicated at the ends of the program gates 1805 and 1806 opposite from the source/drain regions 1840 and 1841 of the transistor.

Use of the vertical device structure illustrated in FIG. 18 minimizes the cell area such that each cell is only two feature (2F) sizes in length. A typical prior art NROM flash memory cell with a split gate structure requires four feature (4F) sizes in length.

Figure 19:
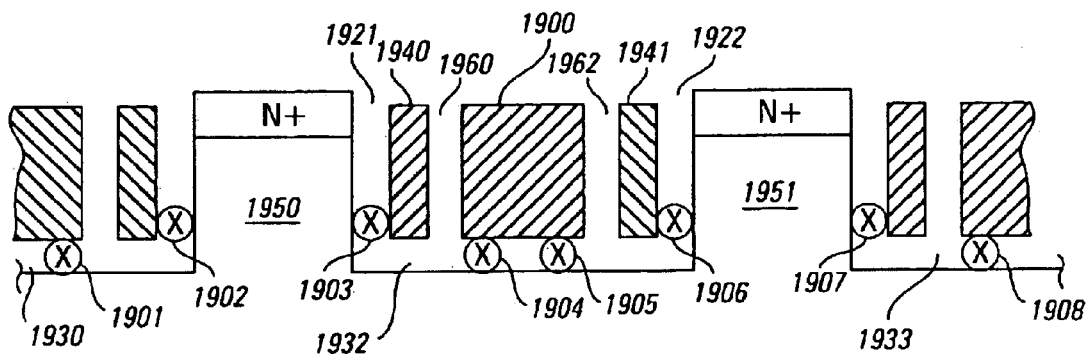
FIG. 19 is a cross sectional view of another vertical NROM memory cell embodiment incorporating the split gate of the present invention.

FIG. 19 illustrates a cross sectional view of another vertical NROM memory cell embodiment incorporating the split gate of the present invention. As in the embodiment of FIG. 18, the control gate 1900 is between the two split program gates 1940 and 1941. The gate insulators 1921 and 1922 separate the program gates 1940 and 1941 from the pillars 1950 and 1951. In one embodiment, the gate insulators 1921 and 1922 are a composite ONO layer. Alternate embodiments include the structures listed above in the discussion of FIG. 18.

The embodiment of FIG. 19 includes charge storage areas 1902, 1903, 1906, and 1907 as disclosed in the embodiment of FIG. 18. The embodiment of FIG. 19, however, includes additional charge storage areas 1901, 1904, 1905, and 1908 in the trench bottoms. This is accomplished by using an ONO interpoly insulator material 1930, 1932, and 1933 in the trench bottoms. Alternate embodiments use the structures listed above instead of the ONO layer. In one embodiment, a conventional oxide insulator 1960 and 1962 is used between the control gate 1900 and the program gates 1940 and 1941.

Figure 20:
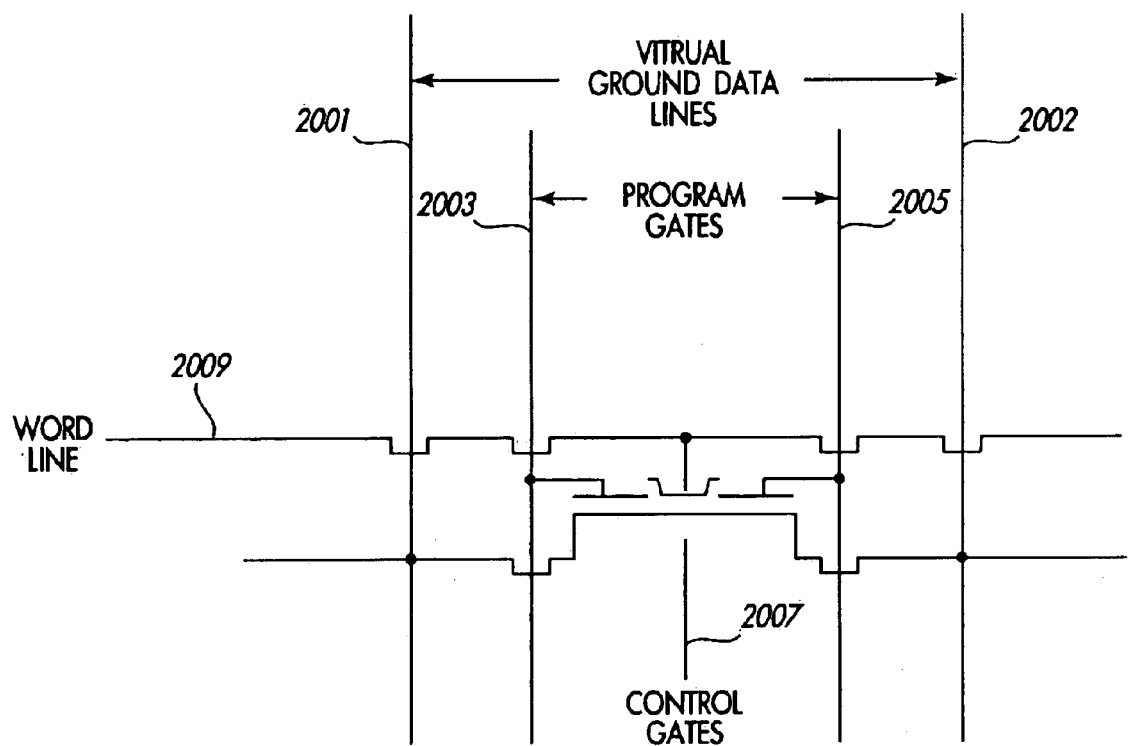
FIG. 20 is an electrical equivalent circuit of the vertical split gate NROM devices of the present invention.

FIG. 20 illustrates an electrical equivalent circuit of the vertical split gate NROM devices of the embodiments of FIGS. 18 and 19. The circuit shows the two virtual ground data lines 2001 and 2002, the two program gates 2003 and 2005, and the control gate 2007. A word line 2009 couples the control gates 2007 of each of the memory cells in a row of memory cells of a memory cell array.

The NROM device can be programmed using conventional channel hot electron injection or source side injection. The NROM device can be erased using negative gate FN tunneling and band-to-band tunneling induced hot hole injection. These techniques are well known in the art and are not discussed further.

The vertical NROM devices incorporating the split gate feature can be fabricated using the above-described methods for vertical transistor fabrication, with minor modifications. The NROM devices form the program gates along the sidewalls of the oxide pillars and the single control gate forms a transistor channel along the bottom of the trench. The control gate is formed in the trench between the program gates and N+ regions are formed only at the tops of the pillars to form the data or bit lines of the present invention.

From the foregoing it will be appreciated that, although specific embodiments of the invention have been described herein for purposes of illustration, various modifications may be made without deviating from the spirit and scope of the invention. For example, certain features shown in the context of one embodiment of the invention may be incorporated into other embodiments as well. Accordingly, the invention is not limited by the foregoing description of embodiments except as by the following claims.

What is claimed is:

1. A vertical NROM memory cell comprising:
   a plurality of oxide pillars each having a source/drain region formed at the top, a trench being formed between each pair of oxide pillars;
   a control gate formed between each pair of oxide pillars;
   a plurality of program gates, each formed between the control gate and each oxide pillar, each program gate extending along the oxide pillar sidewall; and
   a plurality of gate insulator layers, each gate insulator layer formed between each program gate and the adjacent oxide pillar, each gate insulator layer having a structure for trapping at least one charge.

2. The memory cell of claim 1 wherein the plurality of gate insulators are comprised of a composite oxide-nitride-oxide structure such that the nitride layer the charge trapping structure.

3. The memory cell of claim 1 and further including a silicon oxide gate insulator formed between the control gate and the adjacent program gates and along the bottom of the trench.

4. The memory cell of claim 1 wherein each gate insulator layer is a composite layer comprised of one of an oxide-nitride-aluminum oxide composite layer, an oxide-aluminum oxide-oxide composite layer, or an oxide-silicon oxycarbide-oxide composite layer.

5. The memory cell of claim 1 wherein each gate insulator layer is a non-composite layer comprised of one of silicon oxides formed by wet oxidation and not annealed, silicon-rich oxides with inclusions of nanoparticles of silicon, silicon oxynitride layers, silicon-rich aluminum oxide insulators, silicon oxycarbide insulators, or silicon oxide insulators with inclusions of nanoparticles of silicon carbide.

6. The memory cell of claim 1 wherein each gate insulator is comprised of non-stoichiometric single layers of two or more of silicon, nitrogen, aluminum, titanium, tantalum, hafnium, lanthanum, or zirconium.

7. A vertical NROM memory cell comprising:
a plurality of oxide pillars each having a source/drain region formed at the top, a trench being formed between each pair of oxide pillars;
a control gate formed between each pair of oxide pillars;
a plurality of program gates, each formed between the control gate and each oxide pillar, each program gate extending along the oxide pillar sidewall;
a plurality of gate insulator layers, each gate insulator layer formed between each program gate and the adjacent oxide pillar sidewall, each gate insulator layer having a structure for trapping at least one charge; and
an oxide interpoly layer formed between the control gate and each adjacent program gate.

8. The memory cell of claim 7 and further including a gate insulator layer formed on the bottom of the trench such that a plurality of charges can be trapped under the control gate in the gate insulator layer.

9. The memory cell of claim 8 wherein the plurality of charges are trapped in a nitride layer of the gate insulator layer under the control gate.

10. An array of vertical NROM memory cells comprising:
a plurality of oxide pillars each having a source/drain region formed at the top, a trench being formed between each pair of oxide pillars;
a plurality of control gates, each control gate formed in the trench between each pair of oxide pillars;
a plurality of program gates, each formed in the trench between a first control gate and each oxide pillar, each program gate extending along the oxide pillar sidewall;
a plurality of gate insulator layers, each gate insulator layer formed between each program gate and the adjacent oxide pillar, each gate insulator layer having a structure for trapping at least one charge; and
a word line coupling the plurality of control gates.

11. The array of claim 10 and further including:
an oxide interpoly material between each control gate and each program gate; and
a gate insulator layer on the bottom of each trench and comprising a structure for storing a plurality of charges under each control gate.

12. The array of claim 10 wherein each source/drain region is comprised of an n-type conductivity semiconductor material.

13. A computer system, comprising:
a central processing unit (CPU); and
an array of vertical NROM memory cells coupled to the CPU, the array including:
a plurality of oxide pillars each having a source/drain region formed at the top, a trench being formed between each pair of oxide pillars;
a plurality of control gates, each control gate formed in the trench between each pair of oxide pillars;
a plurality of program gates, each formed in the trench between a first control gate and each oxide pillar, each program gate extending along the oxide pillar sidewall;
a plurality of gate insulator layers, each gate insulator layer formed between each program gate and the adjacent oxide pillar, each gate insulator layer having a structure for trapping at least one charge; and
a word line coupling the plurality of control gates.

14. The computer system of claim 13 wherein the source/drain region of each oxide pillar acts as either a source connection or a drain connection in response to a direction of operation of the vertical NROM memory cell.

15. The computer system of claim 13 wherein each second source/drain region is comprised of an N+ conductivity silicon material.

16. A method for forming a vertical NROM split gate transistor, the method comprising:
forming a first columnar structure on a substrate, the first columnar structure having a doped region of a first type of conductivity that is different than the substrate, the doped region formed in the top of the first columnar structure;
forming a second columnar structure on the substrate that is spaced apart from the first columnar structure to form a trench between the two columnar structures, the second columnar structure having a doped region of the first type of conductivity formed in the top of the second columnar structure;
forming an oxide material on the bottom of the trench;
forming a polysilicon control gate structure between the first and second columnar structures;
forming a first gate insulator layer in the trench along the sidewall of the first columnar structure and a second gate insulator layer in the trench along the sidewall of the second columnar structure; and
interposing a polysilicon program gate structure between the first gate insulator layer and the control gate structure and between the second gate insulator layer and the control gate structure.

17. The method of claim 16 and further including forming an oxide interpoly region between the control gate structure and the program gate structures.

18. The method of claim 16 wherein the first type of conductivity is N+ and the substrate has a P+ conductivity.

19. The method of claim 16 wherein forming the first and second gate insulator layers comprises forming a composite oxide-nitride-oxide layer.

20. A method for forming a vertical NROM split gate transistor, the method comprising:
forming a first columnar structure on a substrate, the first columnar structure having a doped region of a first type of conductivity that is different than the substrate;
forming a second columnar structure on the substrate that is spaced apart from the first columnar structure to form a trench between the two columnar structures, the second columnar structure having a doped region of the first type of conductivity;
forming a bottom gate insulator layer on the bottom of the trench;
forming a polysilicon control gate structure between the first and second columnar structures;
forming a first gate insulator layer in the trench along the sidewall of the first columnar structure and a second gate insulator layer in the trench along the sidewall of the second columnar structure, wherein the bottom, first, and second gate insulator layers are a composite structure; and
interposing a polysilicon program gate structure between the first gate insulator layer and the control gate structure and between the second gate insulator layer and the control gate structure.

21. The method of claim 20 wherein the composite structure is comprised of one of an oxide-nitride-aluminum oxide composite layer, an oxide-aluminum oxide-oxide composite layer, or an oxide-silicon oxycarbide-oxide composite layer.

22. The method of claim 20 wherein the bottom, first, and second gate insulator layers are comprised of non-stoichiometric single layers of two or more of silicon, nitrogen, aluminum, titanium, tantalum, hafnium, lanthanum, or zirconium.

23. The method of claim 20 wherein the bottom, first, and second gate insulator layers are non-composite layers comprised of one of silicon oxides formed by wet oxidation and not annealed, silicon-rich oxides with inclusions of nanoparticles of silicon, silicon oxynitride layers, silicon-rich aluminum oxide insulators, silicon oxycarbide insulators, or silicon oxide insulators with inclusions of nanoparticles of silicon carbide.

* * * * *